(12) United States Patent
Flitsch

(10) Patent No.: US 10,651,063 B2
(45) Date of Patent: May 12, 2020

(54) METHODS OF PROTOTYPING AND MANUFACTURING WITH CLEANSPACE FABRICATORS

(71) Applicant: Frederick A. Flitsch, New Windsor, NY (US)

(72) Inventor: Frederick A. Flitsch, New Windsor, NY (US)

( * ) Notice: Subject to any disclaimer, the term of this patent is extended or adjusted under 35 U.S.C. 154(b) by 880 days.

(21) Appl. No.: 15/241,419

(22) Filed: Aug. 19, 2016

(65) Prior Publication Data

US 2016/0358795 A1  Dec. 8, 2016

Related U.S. Application Data

(60) Continuation-in-part of application No. 14/988,735, filed on Jan. 5, 2016, and a continuation-in-part of application No. 14/689,980, filed on Apr. 17, 2015, now abandoned, and a continuation-in-part of application No. 13/829,212, filed on Mar. 14, 2013, now abandoned, and a continuation-in-part of application No. 13/747,091, filed on Jan. 22, 2013, now abandoned, said application No. 14/689,980 is a continuation-in-part of application No. 13/398,371, filed on Feb. 16, 2012, now Pat. No. 9,059,227, which is a continuation-in-part of application No. 11/980,850, filed on Oct. 31, 2007, now abandoned, and a continuation-in-part of application No. 11/520,975, filed on Sep. 14, 2006, now Pat. No. 8,229,585, said application No. 14/988,735 is a continuation-in-part of application No. 11/502,689, (Continued)

(51) Int. Cl.
*H01L 21/67* (2006.01)
*B08B 15/00* (2006.01)
*G05B 19/418* (2006.01)
*H01L 21/677* (2006.01)

(52) U.S. Cl.
CPC ........ *H01L 21/67178* (2013.01); *B08B 15/00* (2013.01); *G05B 19/418* (2013.01); *H01L 21/67017* (2013.01); *H01L 21/67276* (2013.01); *H01L 21/67727* (2013.01); *G05B 2219/45031* (2013.01); *Y10T 29/53096* (2015.01)

(58) Field of Classification Search
CPC ......... H01L 21/67178; H01L 21/67017; H01L 21/67276; H01L 21/67727; B08B 15/00; G05B 19/418; G05B 2219/45031; Y10T 29/53096
USPC .................................................. 700/95, 112
See application file for complete search history.

(56) References Cited

U.S. PATENT DOCUMENTS 3,158,457 A   11/1964  Whitfield
3,588,176 A    6/1971  Byrne
(Continued)

FOREIGN PATENT DOCUMENTS

WO      2004109748 A2    12/2004

*Primary Examiner* — James J Lee
*Assistant Examiner* — Michael W Choi
(74) *Attorney, Agent, or Firm* — Frederick A. Flitsch

(57) ABSTRACT

The present invention provides various aspects for processing multiple types of substrates within cleanspace fabricators or for processing multiple or single types of substrates in multiple types of cleanspace environments. In some embodiments, a collocated composite cleanspace fabricator may be capable of processing semiconductor devices into integrated circuits and then performing assembly operations to result in product in packaged form.

11 Claims, 9 Drawing Sheets

110

120

130

140

Related U.S. Application Data filed on Aug. 12, 2006, now Pat. No. 9,339,900, said application No. 11/980,850 is a division of application No. 11/156,205, filed on Jun. 18, 2005, now Pat. No. 7,513,822.

(56) References Cited

U.S. PATENT DOCUMENTS

| | | |
|---|---|---|
| 3,603,646 A | 9/1971 | Leoff |
| 3,812,947 A | 5/1974 | Nygaard |
| 3,930,684 A | 1/1976 | Lasch et al. |
| 3,976,330 A | 8/1976 | Babinski et al. |
| 4,081,201 A | 3/1978 | Hassan et al. |
| 4,165,132 A | 8/1979 | Hassan et al. |
| 4,267,769 A | 5/1981 | Davis et al. |
| 4,278,366 A | 7/1981 | Loveless et al. |
| 4,299,518 A | 11/1981 | Whelan |
| 4,315,705 A | 2/1982 | Flint |
| 4,348,139 A | 9/1982 | Hassan et al. |
| 4,409,889 A | 10/1983 | Burleson |
| 4,501,527 A | 2/1985 | Jacoby et al. |
| 4,554,766 A | 11/1985 | Ziemer et al. |
| 4,608,066 A | 8/1986 | Cadwell |
| 4,612,946 A | 9/1986 | Noh et al. |
| 4,620,353 A | 11/1986 | Pryor |
| 4,649,830 A | 3/1987 | Tanaka |
| 4,667,579 A | 5/1987 | Daw |
| 4,667,580 A | 5/1987 | Wetzel |
| 4,676,144 A | 6/1987 | Smith |
| 4,682,927 A | 7/1987 | Southworth et al. |
| 4,693,175 A | 9/1987 | Hashimoto |
| 4,694,736 A | 9/1987 | Yamagata et al. |
| 4,695,215 A | 9/1987 | Jacoby et al. |
| 4,699,640 A | 10/1987 | Suzuki et al. |
| 4,722,659 A | 2/1988 | Hoyt et al. |
| 4,804,392 A | 2/1989 | Spengler |
| 4,826,360 A | 5/1989 | Iwasawa et al. |
| 4,840,530 A | 6/1989 | Nguyen |
| 4,851,018 A | 7/1989 | Lazzari et al. |
| 4,861,222 A | 8/1989 | Mirkovich |
| 4,867,629 A | 9/1989 | Iwasawa et al. |
| 4,875,825 A | 10/1989 | Tullis et al. |
| 4,923,352 A | 5/1990 | Tamura et al. |
| 4,963,069 A | 10/1990 | Wurst et al. |
| 4,964,776 A | 10/1990 | Wakita et al. |
| 5,029,518 A | 7/1991 | Austin |
| 5,058,491 A | 10/1991 | Wiemer et al. |
| 5,096,477 A | 3/1992 | Shinoda et al. |
| 5,108,513 A | 4/1992 | Muller et al. |
| 5,133,561 A | 7/1992 | Hattori et al. |
| 5,139,459 A | 8/1992 | Takahashi et al. |
| 5,145,303 A | 9/1992 | Clarke |
| 5,167,575 A | 12/1992 | MacDonald |
| 5,217,273 A | 6/1993 | Hendricsen et al. |
| 5,219,464 A | 6/1993 | Yamaga et al. |
| 5,256,105 A | 10/1993 | Austin |
| 5,259,812 A | 11/1993 | Kleinsek |
| 5,326,316 A | 7/1994 | Hashimoto et al. |
| 5,344,365 A | 9/1994 | Scott et al. |
| 5,358,420 A | 10/1994 | Cairns et al. |
| 5,385,505 A | 1/1995 | Sharp et al. |
| 5,425,793 A | 6/1995 | Mori et al. |
| 5,513,946 A | 5/1996 | Sawada et al. |
| 5,518,451 A | 5/1996 | Renz et al. |
| 5,562,539 A | 10/1996 | Hashimoto et al. |
| 5,570,990 A | 11/1996 | Bonora et al. |
| 5,641,354 A | 6/1997 | Sakauchi et al. |
| 5,779,799 A | 7/1998 | Davis |
| 5,795,356 A | 8/1998 | Leveen |
| 5,827,118 A | 10/1998 | Johnson et al. |
| 5,848,933 A | 12/1998 | Roberson et al. |
| 5,860,258 A | 1/1999 | Faith et al. |
| 5,863,246 A | 1/1999 | Bujak |
| 6,040,235 A | 3/2000 | Badehi |
| 6,082,949 A | 7/2000 | Rosenquist |
| 6,091,498 A | 7/2000 | Hanson et al. |
| 6,099,599 A | 8/2000 | Wu |
| 6,138,721 A | 10/2000 | Bonora et al. |
| 6,183,358 B1 | 2/2001 | Adair |
| 6,186,723 B1 | 2/2001 | Murata et al. |
| 6,220,808 B1 | 4/2001 | Bonora et al. |
| 6,221,160 B1 | 4/2001 | Lin |
| 6,238,283 B1 | 5/2001 | Matsuyama et al. |
| 6,267,131 B1 | 7/2001 | Masada et al. |
| 6,306,189 B1 | 10/2001 | Renz |
| 6,312,525 B1 * | 11/2001 | Bright ............... H01L 21/67017 118/719 |
| 6,322,597 B1 | 11/2001 | Ohta |
| 6,328,768 B1 | 12/2001 | Ohta |
| 6,338,371 B1 | 1/2002 | Araki et al. |
| 6,382,895 B1 | 5/2002 | Konishi et al. |
| 6,431,948 B1 | 8/2002 | Atoh |
| 6,574,937 B1 | 6/2003 | Rapisarda et al. |
| 6,582,178 B2 | 6/2003 | Petruccelli |
| 6,591,162 B1 | 7/2003 | Martin |
| 6,598,279 B1 | 7/2003 | Morgan |
| 6,612,084 B2 | 9/2003 | Rapisarda et al. |
| 6,654,122 B1 | 11/2003 | Hanson et al. |
| 6,672,820 B1 | 1/2004 | Hanson et al. |
| 6,677,690 B2 | 1/2004 | Fosnight et al. |
| 6,694,759 B1 | 2/2004 | Bash et al. |
| 6,736,582 B1 | 5/2004 | Mages et al. |
| 6,755,221 B2 | 6/2004 | Jeong et al. |
| 6,776,850 B2 | 8/2004 | Liao et al. |
| 6,854,583 B1 | 2/2005 | Horn |
| 6,869,457 B2 | 3/2005 | Nakagawa |
| 6,875,282 B2 | 4/2005 | Tanaka et al. |
| 6,902,762 B2 | 6/2005 | Miyata |
| 6,955,595 B2 | 10/2005 | Kim |
| 7,014,672 B2 | 3/2006 | Ishihara et al. |
| 7,039,999 B2 | 5/2006 | Tarr et al. |
| 7,077,173 B2 | 7/2006 | Tokunaga |
| 7,083,515 B2 | 8/2006 | Rapisarda et al. |
| 7,216,497 B2 | 5/2007 | Hull et al. |
| 7,257,458 B1 | 8/2007 | Markle |
| 7,269,925 B2 | 9/2007 | Lam |
| 7,513,822 B2 | 4/2009 | Flitsch |
| 7,669,777 B2 | 3/2010 | Hull et al. |
| 8,029,225 B2 | 10/2011 | Meulen |
| 8,163,631 B2 | 4/2012 | Chiang et al. |
| 8,197,177 B2 | 6/2012 | Meulen et al. |
| 8,434,989 B2 | 5/2013 | Meulen |
| 8,483,883 B1 | 7/2013 | Watson |
| 8,584,349 B2 | 11/2013 | Scannon et al. |
| 8,596,312 B2 | 12/2013 | Natsume et al. |
| 8,753,063 B2 | 6/2014 | Rebstock |
| 2002/0020751 A1 | 2/2002 | Matsumoto |
| 2002/0025244 A1 | 2/2002 | Kim |
| 2002/0030113 A1 | 3/2002 | Abuzeid et al. |
| 2002/0088543 A1 | 7/2002 | Ashjaee et al. |
| 2002/0129707 A1 | 9/2002 | Tanaka et al. |
| 2002/0143656 A1 | 10/2002 | Matsuo et al. |
| 2002/0176936 A1 | 11/2002 | Matsuyama |
| 2002/0197136 A1 | 12/2002 | Huang et al. |
| 2002/0197530 A1 * | 12/2002 | Tani ................ H01M 4/0416 429/218.2 |
| 2003/0053894 A1 | 3/2003 | Matsumoto |
| 2003/0082030 A1 | 5/2003 | Puerto et al. |
| 2003/0091410 A1 | 5/2003 | Larson et al. |
| 2003/0101938 A1 | 6/2003 | Ronsse et al. |
| 2003/0198541 A1 | 10/2003 | Davis et al. |
| 2003/0201442 A1 * | 10/2003 | Makita ................ H01L 27/1214 257/66 |
| 2003/0202866 A1 | 10/2003 | Weng et al. |
| 2003/0230031 A1 | 12/2003 | Lam |
| 2004/0003664 A1 * | 1/2004 | Ishikawa ............. G01N 29/223 73/644 |
| 2004/0006544 A1 | 1/2004 | Gulett |
| 2004/0047714 A1 | 3/2004 | Poli et al. |
| 2004/0062627 A1 | 4/2004 | Aggarwal et al. |
| 2004/0081546 A1 | 4/2004 | Elliott et al. |
| 2004/0094087 A1 * | 5/2004 | Ivanov ............. H01L 21/67017 118/300 |
| 2004/0157463 A1 | 8/2004 | Jones |

(56) References Cited

U.S. PATENT DOCUMENTS

| | | |
|---|---|---|
| 2004/0187451 A1 | 9/2004 | Suzuki et al. |
| 2004/0207836 A1 | 10/2004 | Chhibber et al. |
| 2004/0225462 A1 | 11/2004 | Renken et al. |
| 2004/0226510 A1 | 11/2004 | Hanson et al. |
| 2004/0250762 A1 | 12/2004 | Shigetomi et al. |
| 2005/0005957 A1 | 1/2005 | Yamagata et al. |
| 2005/0014370 A1 | 1/2005 | Jones |
| 2006/0033080 A1* | 2/2006 | Harada ............... H01L 51/0007 252/301.16 |
| 2006/0213842 A1 | 9/2006 | Shani et al. |
| 2007/0046284 A1 | 3/2007 | Renken et al. |
| 2008/0089765 A1 | 4/2008 | Moriya et al. |
| 2009/0184089 A1* | 7/2009 | Chebi ................. H01J 37/3244 216/13 |
| 2009/0326703 A1* | 12/2009 | Presley ............ H01L 21/67161 700/112 |
| 2011/0245964 A1 | 10/2011 | Sullivan et al. |
| 2014/0193606 A1* | 7/2014 | Kwong .................. C30B 29/20 428/138 |
| 2015/0227136 A1 | 8/2015 | Flitsch |

\* cited by examiner

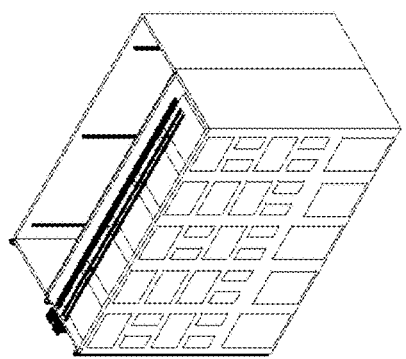
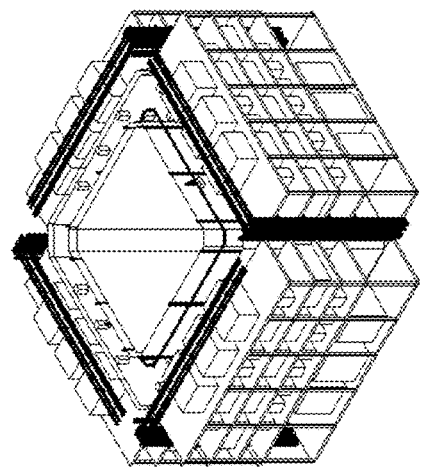
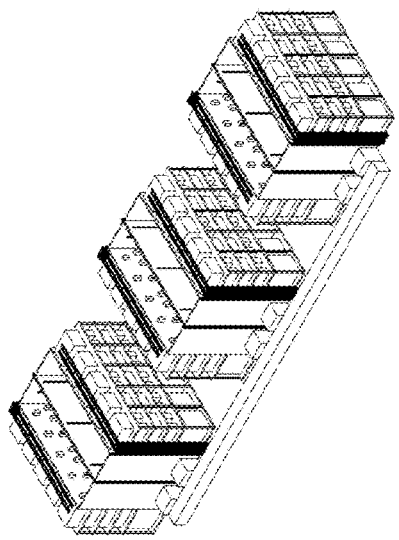
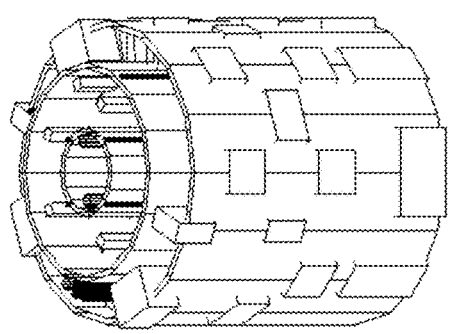
FIG. 1

METHODS OF PROTOTYPING AND MANUFACTURING WITH CLEANSPACE FABRICATORS

CROSS REFERENCE TO RELATED APPLICATIONS

This application claims priority to the U.S. patent application Ser. No. 13/829,212 filed Mar. 14, 2013 as a continuation in part. This application claims priority to the U.S. patent application Ser. No. 14/988,735 filed Jan. 5, 2016 as a continuation in part, which in turn claims priority to Ser. No. 14/703,552 filed May 4, 2015 now U.S. Pat. No. 9,263,309 issued Feb. 16, 2016 as a continuation in part; which in turn claims priority to the U.S. patent application Ser. No. 14/134,705 filed Dec. 19, 2013 now U.S. Pat. No. 9,159,592 issued Oct. 13, 2015; which in turn claims the benefit of the U.S. Provisional Application 61/745,996 filed Dec. 26, 2012. This application is a continuation in part of the Utility application Ser. No. 14/689,980, filed Apr. 17, 2015. The application Ser. No. 14/689,980 in turn is a continuation in part of the Utility application Ser. No. 13/398,371, filed Feb. 16, 2012 now U.S. Pat. No. 9,059,227, issued Jun. 16, 2015. The application Ser. No. 13/398,371 in turn is a continuation in part of the Utility application Ser. No. 11/980,850, filed Oct. 31, 2007. The application Ser. No. 11/980,850 in turn is a Division of the Utility application Ser. No. 11/156,205, filed Jun. 18, 2005 now U.S. Pat. No. 7,513,822, issued Apr. 7, 2009. The application Ser. No. 13/398,371 in turn is a continuation in part of the Utility application Ser. No. 11/520,975, filed Sep. 14, 2006 now U.S. Pat. No. 8,229,585, issued Jul. 24, 2012. The application Ser. No. 14/988,735 also claims priority as a continuation in part of the U.S. patent application Ser. No. 11/502,689, filed Aug. 12, 2006 now U.S. Pat. No. 9,339,900 issued May 17, 2016 as a continuation in part application. The U.S. patent application Ser. No. 11/502,689 in turn claims priority to the following Provisional Applications: Provisional Application Ser. No. 60/596,343, filed Sep. 18, 2005; and also Provisional Application Ser. No. 60/596,173, filed Sep. 6, 2005; and also Provisional Application Ser. No. 60/596,099, filed Aug. 31, 2005; and also Provisional Application Ser. No. 60/596,053 filed Aug. 26, 2005; and also Provisional Application Ser. No. 60/596,035 filed Aug. 25, 2005; and also Provisional Application Ser. No. 60/595,935 filed Aug. 18, 2005. This application claims priority to U.S. patent application Ser. No. 13/734,963 filed Jan. 5, 2016 as a continuation in part. The contents of these heretofore mentioned applications are relied upon and hereby incorporated by reference.

FIELD OF THE INVENTION

The present invention relates to methods and apparatus that support prototyping and manufacturing based upon the environment created by cleanspace fabricators. More specifically, the present invention relates to methods of utilizing fabricator designs which may be used to process high technology products and assemble them into a packaged form with a focus on the utilization of additive manufacturing techniques and 3D chip assembly techniques.

BACKGROUND OF THE INVENTION

A known approach to advanced technology fabrication of materials, such as semiconductor substrates, is to assemble a manufacturing facility as a "cleanroom." In such cleanrooms, processing tools are arranged to provide aisle space for human operators or automation equipment. Exemplary cleanroom design is described in: "Cleanroom Design, Second Edition," edited by W. Whyte, published by John Wiley & Sons, 1999, ISBN 0-471-94204-9, (herein after referred to as "the Whyte text").

Cleanroom design has evolved over time from an initial starting point of locating processing stations within clean hoods. Vertical unidirectional airflow can be directed through a raised floor, with separate cores for the tools and aisles. It is also known to have specialized mini-environments which surround only a processing tool for added space cleanliness. Another known approach includes the "ballroom" approach, wherein tools, operators and automation all reside in the same cleanroom.

Evolutionary improvements have enabled higher yields and the production of devices with smaller geometries. However, known cleanroom design has disadvantages and limitations.

For example, as the size of tools has increased and the dimensions of cleanrooms have increased, the volume of cleanspace that is controlled has concomitantly increased. As a result, the cost of building the cleanspace, and the cost of maintaining the cleanliness of such cleanspace, has increased considerably. Not all processing steps, like for example the steps used to assembly products into their packaging, need to occur in the developing large processing environments.

Additionally, the processing of high technology products may typically be split into portions that require high levels of cleanliness in the manufacturing environment which are typically at the beginning of the processing and then steps like the assembly steps which have less critical contamination sensitive processing. In some cases these two types of processing steps may be processed in different facilities because of their different needs. Yet, in many small volume activities, the need for rapid processing of all steps to result in a product that can be utilized in its fully processed form may be important. It would therefore be useful to have an efficient processing fabricator design that can process the different types of steps of multiple cleanliness requirements in a single location with rapidity.

SUMMARY OF THE INVENTION

Accordingly, building on the types of environments defined in previous patents related to cleanspace environments, there are novel methods to utilize cleanspace fabricators for the purposes of both prototyping and manufacturing. Some of the processing steps may occur with substrates that are in a wafer form; while other steps may occur in substrates which are cut outs from that wafer form. Other substrates may relate to the processing of other types of components that may be married with semiconductor components such as for example displays and energization elements. Accordingly, the present invention provides description of how the previously discussed strategies can be taken further to define methods and apparatus of utilizing cleanspace fabricator environments capable of processing high technology products from initial wafer substrate form to final packaging into products that are complete prototypes and marketed goods. The utilization of additive manufacturing techniques and three dimensional chip packaging (hereafter referred to as 3DIC) techniques provide novel applications. Moreover, the products that may be fabricated in the unique environment may provide novel devices in their own right. The ability to process in cleanspace environments or a single cleanspace environment in one location may dramatically alter the form factor on components assembled into product goods. For example, when ICs are placed directly from a testing environment into products without shipping, the ICs may be placed as singulated dice or pieces that are not covered in packaging. The work flows may save on packaging costs, testing costs and allow for much quicker turn around cycles and more unique product definitions.

Various type of processing tools can be placed with each port inside the first cleanspace and the body of each processing tool can be placed at a location peripheral to the cleanspace boundary wall, such that in some embodiments at least a portion of the tool body is outside the first cleanspace. In some embodiments, the substrate carriers that carry substrates while they move in the first cleanspace may be different for the different types of processing and the different types and sizes of substrates.

In some embodiments of the processing environment, a combination of multiple discrete but collocated cleanspace fabricators may be formed and used to process high technology substrates which start in wafer form and are later added to other substrates. The adding process may relate to pieces of the wafer form. A combination of multiple cleanspace fabricators which are joined but have separate primary cleanspace regions for the different forms of processing is also possible. In other forms, a cleanspace fabricator of one type may be combined with another of a different type for the two different types of substrate processing.

In a different type of embodiment, there may be only a single type of cleanspace fabricator which is populated by tools of the different type of substrate processing types. Since the cleanspace fabricator definitions result in efficient fabricators, it may be fine to move different types of substrates around in a primary cleanspace environment that is sufficient to process high cleanliness requirement processing steps, and therefore is more cleanly than what is needed for the assembly operations. Since the substrates and the carriers that are used to move them around are different, in some embodiments the automation or robotics that is used to move the substrate carriers around the primary cleanspace may be different. Alternatively, a single robot type may have the capability of moving around different types of carriers which contain different types of substrates or the robot may have the capability of moving around different types of substrates alone.

The present invention can therefore include methods and apparatus for processing high technology substrates of different types in collocated environments and forming products of different types in some embodiments including wafers in a complete form, and in some embodiments packaged electronic components.

In some embodiments a combination of two different cleanspace fabricators may be formed to create products. The different fabricators may have automation capable of moving different carriers or different sized substrates in them, and there may be means of moving carriers between the cleanspace environments. Alternatively the cleanspace environment may be a single cleanspace environment with different collections of processing tools that act on different types of substrates where the automation is capable of handling each type of substrate or carrier. Some embodiments may be comprised with at least three different types of substrate processing tools for processing different substrates. In some embodiments a non-complete product may comprise a substrate that changes or has other substrate products added to it as it is processed in different manners.

The different cleanspace fabricators when connected may adjoin each other or in some embodiments may be separated by relatively small distances. In some cases, the separation may be less than or equal to 2 kilometers. In others, the separation may be less than 100 meters.

Different types of substrates may be processed in the different environments as mentioned above. In an exemplary embodiment, a first matrix or collection of processing tools may process substrates that are semiconductor wafers or semiconductor pieces. Continuing with the example, a second matrix or collection of processing tools may process substrates that are formed of glass. Some of these substrates may be rectangular formed substrates that may comprise touch screens. In one or more of the matrices of tools may be located a processing tool that practices additive manufacturing as at least a portion of its processing. In other embodiments, one or more of the matrices of tools may contain a processing tool that may be used to perform three dimensional circuit packaging processes or the similar or equivalent three dimensional integrated circuit processing steps. Some of these there dimensional integrated circuit processing or three dimensional packaging processes may include thru-silicon reactive ion etching or the creation of solder balls. In some embodiments solder balls may be useful in flip chip processing types, but more generally they may be useful for interconnecting devices electrically and to a degree physically. The additive manufacturing may comprise a three dimensional printer in some embodiments. The additive manufacturing tools or processes may create features or add material to a substrate or work product that comprises one or more of a polymeric material, a metallic material, a ceramic material, a gelled material. The additive manufacturing tools or processes may add a biological material which may support living components or be living components.

The techniques described herein may be useful in numerous methods. A method may be useful to create products which are combinations of one of more of integrated circuits, energization elements, display components, sensors, interconnection elements, fuel cells, batteries, discrete electrical switches or connectors, and supporting cases or structure. In some embodiments a method may comprise introducing a semiconductor substrate into a cleanspace fabricator where the fabricator comprises at least a first matrix of processing tools. There may be at least two tools comprising a tool body and a tool port each, where one of them is oriented vertically above or below the other at least in part. The processing tools may have at least a portion of their body or port located or interfacing with a fabricator cleanspace. Said cleanspace may comprise a first boundary and a second boundary where each of the processing tools is capable of independent operation and removable in a discrete fashion relative to other processing tools. In some embodiments the processing may also include processing on glass substrates. In some cases, the glass substrates may be in a predominately rectangular shape. In some embodiments the glass substrate may be at least part of a touch screen display. The touch screen display may be formed completely with processing that occurs within the cleanspace fabricator or fabricators or in some cases some discrete components such as switches, connectors, memory devices, batteries or fuel cell components may be added into the cleanspace environment in produced form to be further processed into the product in the cleanspace fabricator. Some of these components, such as for example fuel cells may have some or all of their structure formed within a cleanspace fabricator environment.

The glass substrate may be useful in some embodiments to define a substrate upon which substantially all components are eventually added. The glass substrate may be one of numerous substrates that are processed in the cleanspace fabricator environment, where components are created by processing on the non-glass substrates and then added upon the glass substrate.

In some embodiments, where all or substantially all of components within a product are created with cleanspace fabricators, the product may be designed and electronic models may be passed to the cleanspace fabricator. The resulting product may represent the realization of the electrical design data in a physical form where semiconductor processing steps transform electrical data into functioning circuits and interconnect structures and additive manufacturing steps create structure, encapsulation and surrounding material, which in some cases may have a designed appearance in manners controllable within the fabricator environment. These methods may involve semiconductor substrates being processed in the type of cleanspace environments previously mention, along with glass substrates in the similar or same environment. Interconnect layers may be defined upon the glass substrate with processing steps within the cleanspace fabricator environment, or upon interconnect layers or features that are provided to the working environment of the cleanspace fabricator such as flexible substrates. Electronic circuits fabricated in the cleanspace environment may be attached to the interconnect layers while within the cleanspace environment, and additive manufacturing steps may be performed to encapsulate the various components and create structure of the resulting product. The result may be a prototype for a product or a marketable product as well.

BRIEF DESCRIPTION OF THE DRAWINGS

The accompanying drawings, that are incorporated in and constitute a part of this specification, illustrate several embodiments of the invention and, together with the description, serve to explain the principles of the invention:

FIG. 1 illustrates some exemplary cleanspace fabricators

DETAILED DESCRIPTION OF PREFERRED EMBODIMENTS

The present invention relates to methods and apparatus to process substrates of different types in cleanspace fabricator environments. In some exemplary embodiments of this type of processing, substrates in the form of wafers may be processed to create integrated circuits upon the substrate and then in subsequent processing the integrated circuits can be processed to result in a discrete integrated circuit in its packaging.

Cleanspace fabricators may come in numerous different types. Proceeding to FIG. 1, a number of exemplary cleanspace fabricators are depicted. In item 110, a fabricator is depicted which is made up of numerous essentially planar cleanspace fabricators elements which are connected together. In item 120, a single standalone planar cleanspace is depicted. Item 130, depicts a round tubular annular cleanspace fabricator type. And, item 140 depicts a square exemplary tubular annular cleanspace fabricator type. It may be apparent that many different variations on these fundamental types of fabricators are included in the general art of cleanspace fabricators. In these versions of fabricators, a common mode of operations would be for the fabricators to process wafer form substrates of one type from when the substrates enter the fabricator to when they leave it. A different embodiment type of these fabricators may derive if there are multiple types of substrates that are simultaneously being processed in the fabricator.

Fabricators with Semiconductor Wafer Processing Cleanspace Elements and Semiconductor Die Packaging Cleanspace Elements.

Significant generality has been used in describing cleanspace fabricators because there are numerous types of technology fabrication that are consistent with the art including in an exemplary sense the processing of semiconductor substrates, Microelectromechanical systems, "Lab on Chip" processing, Biochip processing, and many other examples including the processing of substrates which support device production or are incorporated into devices as they are produced. Without losing the generality and purely for exemplary purposes, some examples that relate to the processing of semiconductor substrates will be used to illustrate the inventive art being described.

Figure 2:
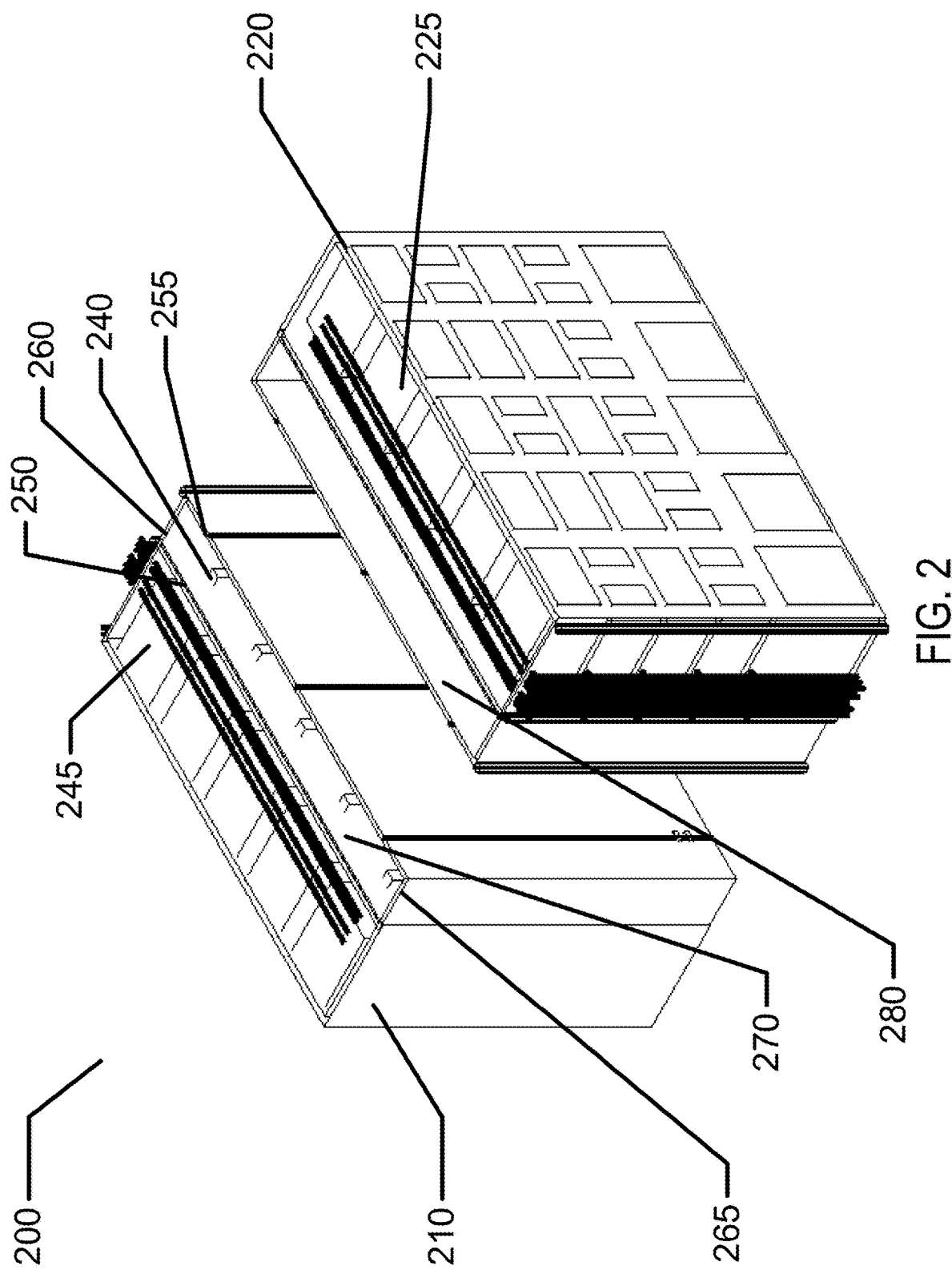
FIG. 2 illustrates an exemplary set of collocated cleanspace fabricators for different types of processing in a single location.

Proceeding to FIG. 2, item 200 two essentially planar cleanspace fabricator elements are depicted. Item 210 depicts a first cleanspace element, which in an exemplary sense, may show a cleanspace fabricator where the substrate type is semiconductor wafers and the equipment or tools used to process semiconductor wafers into integrated circuits on wafers may be depicted for example as item 245. Item 210 is a cleanspace fabricator, and one embodiment type of such a fabricator may have the following distinguishing characteristics. The fabricator has a cleanspace, item 270, which is bounded by walls which span numerous tooling levels. In some embodiments, items 250, 255, 260 and 265 may define walls surrounding the cleanspace 270. Within cleanspace 270, may be located the ports of various processing tools, for example, one of which is depicted as item 240. For that processing tool, on the other side of the cleanspace boundary, item 250, the body of the processing tool may be represented as item 245. In some embodiments, airflow to create the clean environment of the cleanspace may proceed in a unidirectional manner from and through wall 250 to and through wall 255. In other embodiments the direction of the flow may be reversed. In still other embodiments the flow may proceed from wall 250 to wall 255 but do so in a non-unidirectional manner. In some embodiments, walls 260 and 265 may simply be smooth faced walls which do not relate to the flow of air around them, alternatively the walls may either correspond to air source walls or to air receiving walls. As well, the nature of the air source walls may be defined by placing HEPA filters upon the wall and either flowing air through the wall and then through the HEPA Filters or alternatively flowing air to the HEPA filters and then flowing the air out of the filter surface into the cleanspace. There may be other embodiments of the cleanspace type where the airflow in unidirectional fashion or in non-unidirectional fashion may be flowed from the top of the cleanspace to the bottom. There may be numerous manners of defining the airflow within a cleanspace consistent with the art of cleanspace fabrication.

Within the cleanspace, item 270, there may be located automation which is capable of processing wafer carriers which contain the substrates to be processed. In an exemplary fashion, in embodiments where cleanspace fabricator element 210 is formed to process semiconductor wafers to create integrated circuits, the cleanliness requirements of the cleanspace fabricator may be significantly demanding. As shown in FIG. 2, the processing tools may be arranged in a vertical and horizontal manner which in some embodiments may be termed a matrix; that is where tools are generally located at discrete vertical heights or levels and then at various horizontal locations between two standard vertical limits. As the substrates are processed and various electrical elements such as in a non-limiting sense, transistors, resistors, and capacitors are formed and then electrically interconnected with conductive lines, at some point the device structure with its interconnections may be completed. The resulting wafer is an embodiment of one type of product of such operations in a cleanspace fabricator as are the individual results of each processing step. Yet the fully formed product may now have completed the time it needs to spend in the highly clean environment of cleanspace fabricator element 210. A wafer in such a completed form may then be ready to be further processed in manners that may require cleanspace processing but at a significantly less severe cleanliness requirement. As may be apparent, cleanspace fabricators provide an innovative manner to continue such processing. In some embodiments a similar essentially planar cleanspace fabricator, item 220 may be located in the general vicinity of fabricator 210. The cleanspace, 280, of this fabricator 220 may as mentioned be operated at a lower cleanliness requirement when compared to cleanspace 270.

Processing on the substrate, in the wafer form mentioned, may continue in this second cleanspace fabricator element, 220, through a variety of processing steps in a variety of testing and assembly type tools, depicted in an exemplary sense as item 225. The types of testing that may be performed include testing of transistor parameters on test devices, testing of the parametrics of other test devices that model devices or yield related structures, testing of test devices that represent circuit elements within larger devices and testing of fully formed integrated circuits for various aspects of their functionality. In addition testing on a wafer level may be performed on structures that test for the reliability aspects of the processing that has occurred. Other types of testing may involve characterizing physical aspects of the processing that has occurred on the substrate like for example physical thicknesses and roughness for example. Still other embodiments of testing may characterize defectivity aspects of the wafer processing as for example incorporated particulates, missing or extra features on the processed device or other measures of defectiveness. There may be numerous forms of testing that may occur on the substrate which has been processed in a first type of cleanspace environment.

Other processing which may occur in fabricator environment 220 may include steps which take the wafer form of substrate and create different forms of a second substrate type which may be further processed in fabricator 220. An example of such a second form may include "Dice"/"Die" or "Chips". These items may commonly be rectilinear pieces that are cut out of the wafer form substrate. Some of the exemplary processing steps that may be performed in tools of the type that would be placed in fabricator 220 may include thinning of a wafer or die, cutting processes to create the die from the wafer form. Other examples may include polishing steps that can be performed after wafer thinning is performed. The wafers may also have various films and metals deposited on the top or bottom side of the wafer substrate for various purposes.

Other classes of wafer processing that can occur in an "assembly" portion of a multiple substrate cleanspace fabricator may relate to the general processing steps classified as "Wafer Level Packaging" steps. In these steps the thinning, coating and other processing steps to create interconnects and encapsulated package elements are all performed on a wafer level format.

Some of these steps, in other embodiments may relate to chip level packaging. For example, substrates in die form may be attached, glued, affixed or bonded to various forms of metal or insulator packaging. The packages that the dies are mounted to may typically have electrical leads that come out of them in between insulating and hermetically sealing regions. The connection of metal lines from the integrated circuits to the package leads can occur with numerous processing including for example, wire bonding and flip chip or solder bump processing . . . in some processing conductive adhesives, epoxies or pastes may be applied. Thermal processing and annealing may be performed on the wafers, dies or packaged die forms. There may be many other types of processing standard in the art of packaging that would comprise different types of tooling in the exemplary fabricator 220.

More complex processing of the die may occur relating to various 3d packaging schemes where the end product may have in some embodiments multiple levels of die stacked upon each other. Some of the exemplary process types that drive various types of tooling for the processing include thru silicon via processing, die stacking, interposer connection and the like. As mentioned, regardless of the sophistication of the various packaging schemes, processing of substrates of a die form may occur in a cleanspace fabricator environment.

Figure 3:
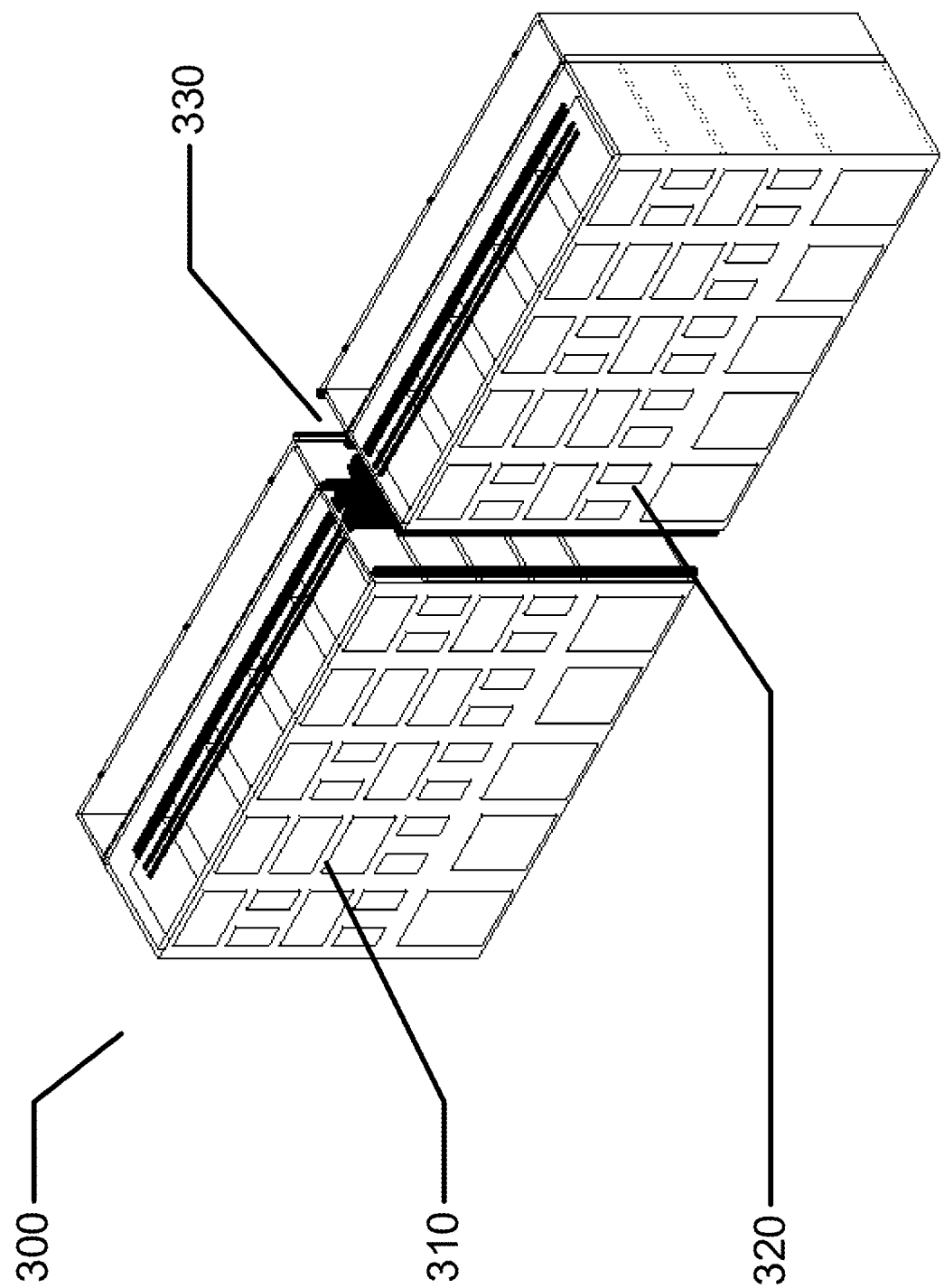
FIG. 3 illustrates an exemplary embodiment where two different cleanspace environments are created in a single cleanspace fabricator design with an intermediate wall.

Proceeding to FIG. 3, item 300, a representation of a different way to configure a cleanspace fabricator to process different types of substrates is shown. In a similar fashion of item 200, there are two different fabricator elements for different cleanspace types. Item 310 may represent a cleanspace, in an exemplary sense, that is of high cleanliness specification, consistent with processing of integrated circuits into semiconductor substrates. Additionally, item 320 may represent the lower cleanliness specification cleanspace environment consistent with "assembly" processing. The two cleanliness environments may be formed in this embodiment type by the insertion of a physical separation, shown as item 330, with an essentially planar fabricator type. Item 330 may be as simple as a wall, or as shown may be two walls on each fabricator element side with various equipment running in between. As mentioned before there may be numerous means to establish the cleanliness of the cleanspace environment through various types and directions of airflow consistent with the art herein.

Exemplary Types of Cleanspace Combinations to Form Collocated Composite Cleanspace Fabricators.

Figure 4:
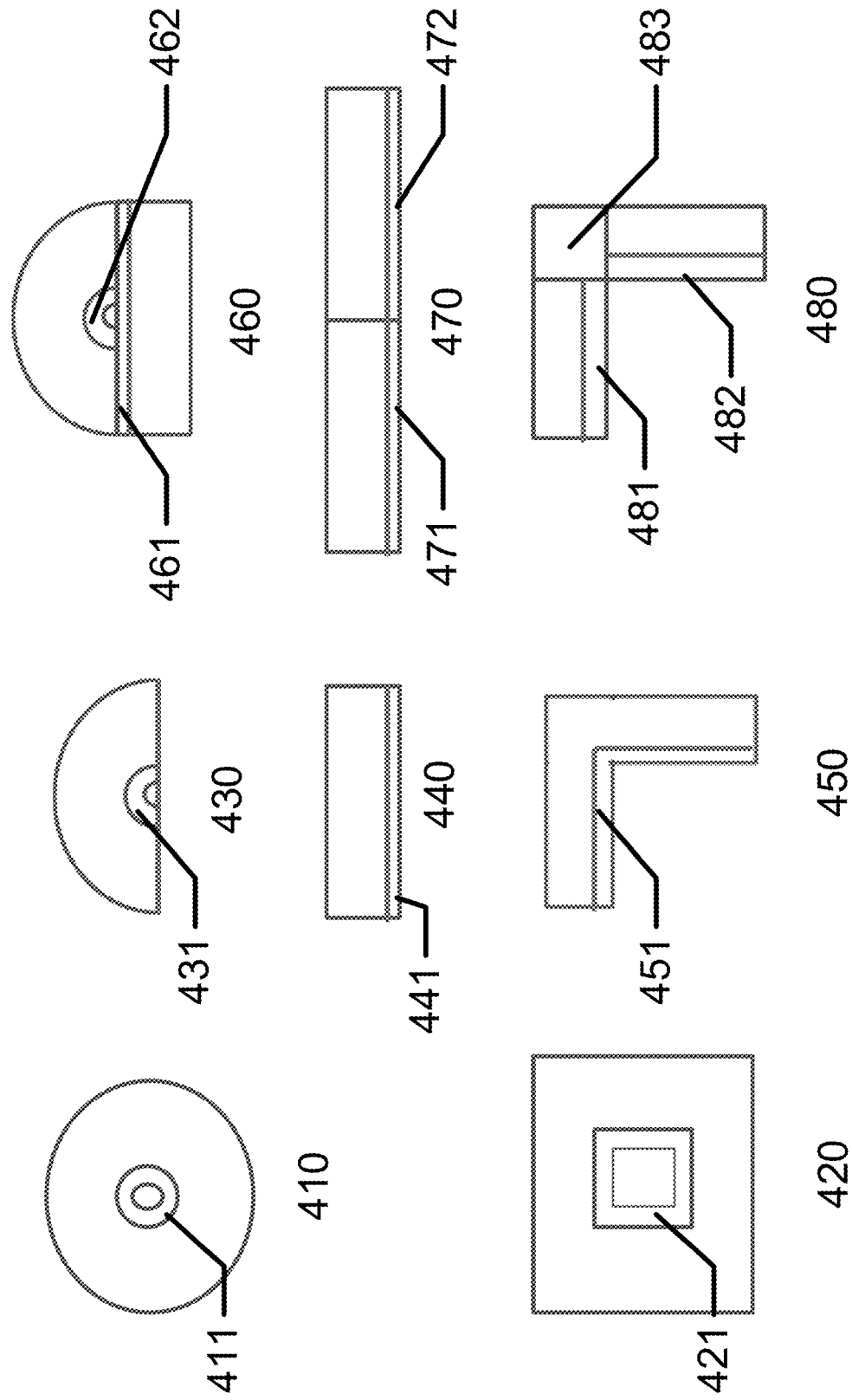
FIG. 4 illustrates exemplary general shapes of cleanspace fabricators with their cleanspaces for annular tubular examples, sections of annual tubular and combinations of various cleanspace fabricators with different cleanspace environments.

In FIG. 4, there are various embodiments of cleanspace fabricators and some exemplary derivations of those types that form fabricators with multiple cleanspace environments associated with processing substrates to different requirements of cleanliness of environment where the multiple environments are at a collocated site. Item 410 and 420 depict simple annular, tubular cleanspace fabricators. Item 410 is a round annular tubular cleanspace fabricator and item 411 may represent a typical location of a primary cleanspace in such a fabricator. Item 420 may represent a rectilinear annular tubular cleanspace fabricator with its exemplary primary cleanspace represented as item 421.

From the two basic cleanspace fabricator types, 410 and 420 a number of additional fab types may be formed by sectional cuts of the basic types. A sectional cut may result in a hemi-circular shaped fabricator, 430 with its exemplary primary cleanspace as item 431. A section cut of item 420 may result in an essentially planar cleanspace fabricator, similar to that discussed in previous figures, where the primary cleanspace is represented by item 441. And in another non-limiting example, a cleanspace fabricator of the type 450 may result from a sectional cut of type 420 where it too may have a primary cleanspace indicated by item 451.

When these various fabricator types are combined with copies of themselves or other types of cleanspace fabricators, a new type of cleanspace fabricator may result which is a composite of multiple cleanspace environments. A few of numerous combinations are depicted. For example, item 460 may represent a combination of a first fabricator of type 430 with a second fabricator of type 460. Item 461 may represent a first cleanspace environment in this composite fab, 460 and item 462 may represent a second type of cleanspace environment. Alternatively, item 470 may be formed by the combination of two versions of fabricator type 440, where the two different primary cleanspace environments are shown as items 471 and 472. This fabricator shares similarity to the type of fabricator depicted in item 300. Another exemplary result may derive from the combination of two fabricators of the type 440 as shown in item 480. Item 480 may have two different primary cleanspace regions, items 481 and 482. And, in some embodiments, item 483 may represent a third cleanspace region. It may be apparent that the generality of combining two different cleanspace elements to form a composite fabricator may be extended to cover fabs made from combinations of 3 or more fabricator cleanspace elements.

Multiple Automation Systems in Cleanspace Environments for the Processing of Multiple Substrate Types.

Figure 5:
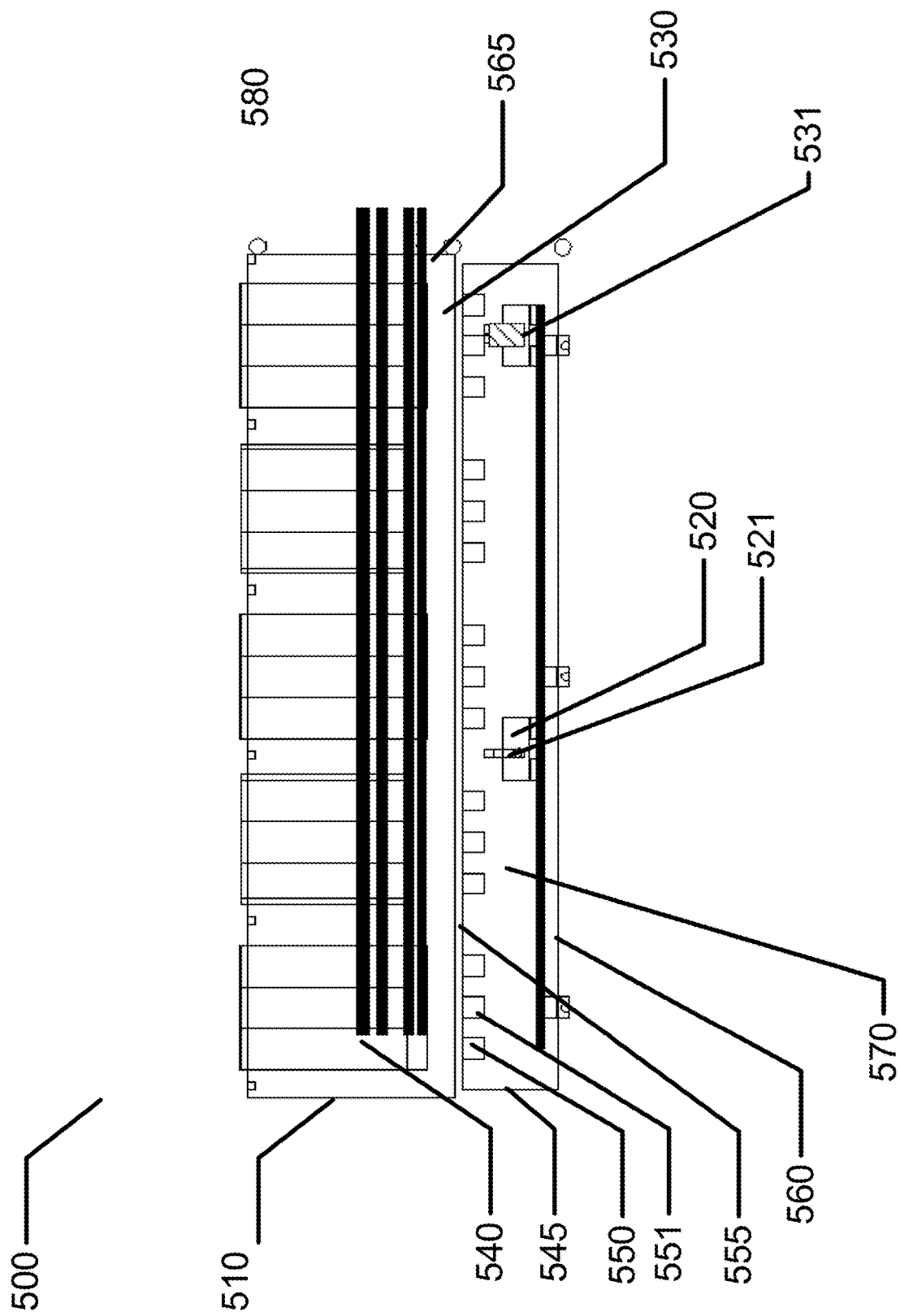
FIG. 5 illustrates an exemplary cleanspace fabricator for processing multiple types of substrates where a single cleanspace environment is utilized with multiple and varied types of automation.

An alternative type of cleanspace environment for processing of multiple types of substrates may be represented by item 500 in FIG. 5. In a fabricator of this type, 510, there may be only one cleanspace environment represented as item 570. In some embodiments, this cleanspace may be defined by a unidirectional airflow flowed from or through wall 555 to wall 560 where walls 545 and 565 are flat walls. In some embodiments, there may be a tool port, 550 which resides significantly in the cleanspace, 570, which may be called a fabricator cleanspace in some embodiments, while a tool body, 540 resides outside this first cleanspace 570.

In some embodiments, the cleanliness of the cleanspace environment, 570, may be uniformly at the highest specification required for any of the processing in the fabricator environment. In such embodiments, therefore, the environment may exceed the needs of other processing steps that are performed within it. Since there may be multiple types of substrates processed in the environment, as for example wafers and die form, there may need to be two different types of automation present to move substrates from tool port to tool port. For example, item 520 may represent a robot that is capable of moving wafer carriers through the use of a robotic arm 521. And, item 530 may represent a piece of automation that is capable of moving die carriers through use of a different robotic arm 531, from tool port to tool port. In fabricators of this type, in some embodiments there may be tools that have two different types of tool port on them, one consistent with handling a first type of substrate like for example wafer carriers and another capable of handling die carriers.

In some embodiments, in a non-limiting sense, such a tool might include a tool for dicing wafer into die. In this case, carriers with wafers would be input into the tool through one port shown for example as item 550 and then die carriers may leave the tool through tool port 551.

Other manners of processing multiple substrates may include for example tools which take substrate carriers from a region external to the cleanspace fabricator like item 580 and place them into the cleanspace environment through a tool port. In a similar fashion, substrates in various types of carriers may also exit the fabricator environment through a processing tool to an external environment like 580 as well. Alternatively there may be other means to directly introduce or remove substrate carriers into the cleanspace environment directly through a cleanspace wall, for example through wall 545.

In any of the cleanspace fabricator embodiments where multiple types of substrates are processed within a single type of cleanspace environment there may be need for multiple types of automation. This may be true for the type of single fabricator environment shown in item 500 or alternatively for the composite types shown previously where multiple substrate types are processed. It may be clear, that another embodiment may derive where the automation devices, like item 520, are capable of handling multiple substrate carrier types.

Types of Carriers that May be Processed within Composite Cleanspace Fabricators

Figure 6:
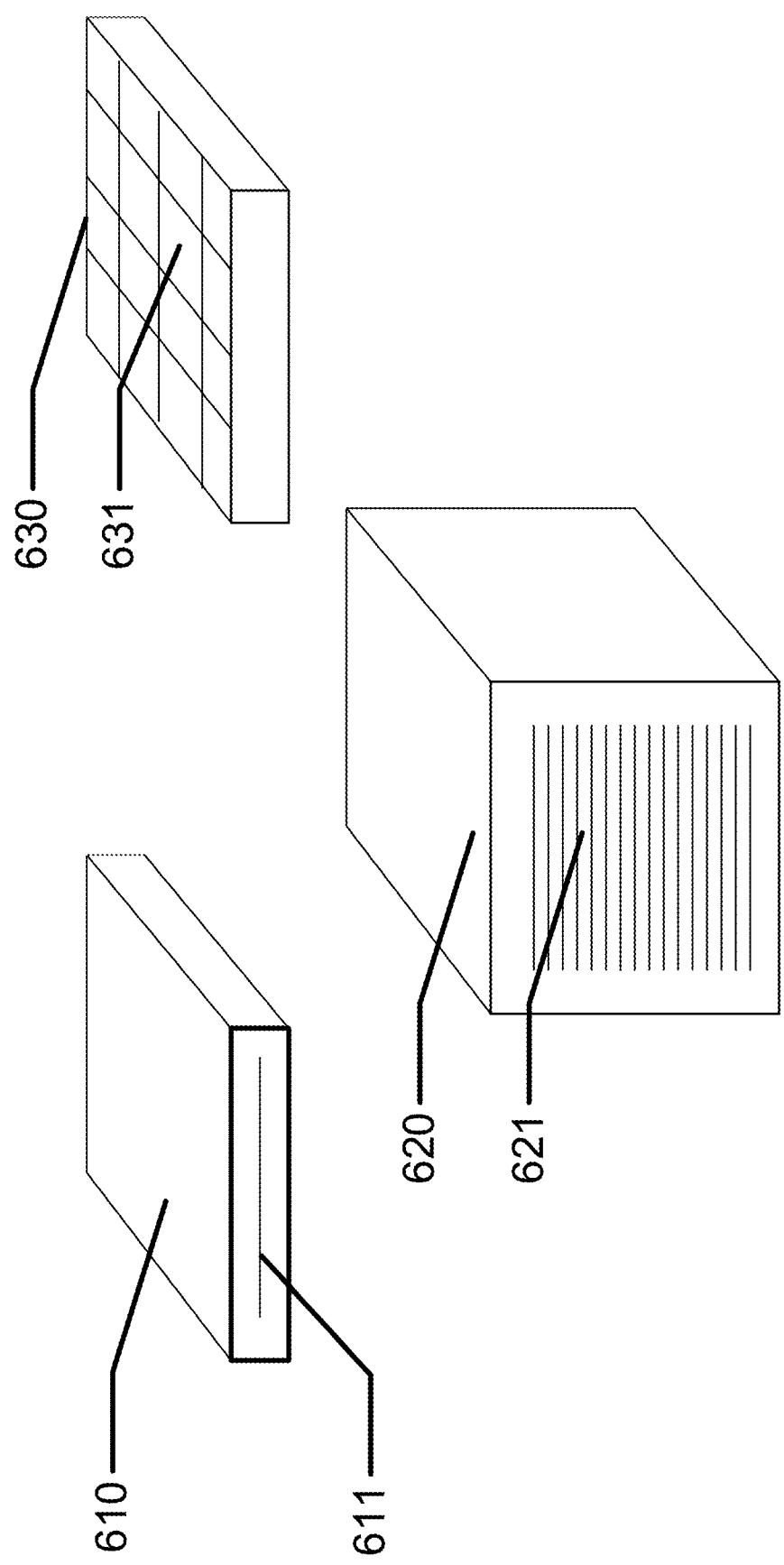
FIG. 6 illustrates examples depicting different types of substrate carriers that might be processed in different processing tools including a single wafer carrier, a multiple wafer carrier and an exemplary waffle pack carrier.

Proceeding to FIG. 6, there are a number of substrate carriers that are depicted for example. In item 610, there is depicted an exemplary substrate carrier where one, 611, substrate piece is included. In some embodiments, the substrate piece may include a semiconductor wafer where the wafer has a dimension of roughly 2 inches. In other embodiments the substrate piece may include a semiconductor wafer where the wafer has a dimension of 8, 12 or 18 inches. In still further embodiments, the substrate piece may be a round, square or sheet which includes semiconductor, metallic and/or insulating material Other types of carriers may have the capability of containing numerous substrate pieces. For example, item 620 may represent a multiple substrate carrier where items 621 are the multiple substrates. There may be numerous types of substrates which include but are not limited to the types discussed in the previous discussion of a single substrate carrier. Some examples of such a carrier might include SMIF pods and FOUPS in the semiconductor industry.

As mentioned in the previous discussions, some substrate types may be defined from pieces of a larger substrate which has been cut into smaller segments. These pieces may be carried around in various types of carriers. An example may be a "waffle pack" 630 where the carrier has multiple wells or chambers 631 into which the segmented substrates may be placed and then carried for further processing.

It may be apparent that a cleanspace fabricator may be capable of processing numerous types of substrates where the substrate processing needs to occur in a clean environment. Although examples of certain substrates have been included, the spirit of the invention is intended to embrace the inclusion of all the different types of substrates that may be processed in a cleanspace fabricator.

Touch Screen Displays as Substrates

In an example of how the cleanspace fabricator environments that have been discussed may be utilized, consider a substrate running in a cleanspace fabricator to be a 4.75 inch by 2.5 inch piece of touchscreen glass. In some embodiments, the example substrate may already have the multiple layers comprising the touch screen elements and the display screen elements upon it. In other embodiments, the layers of conductive electrodes, adhesive and spacer layers, surface treatments for display cleanliness etc. may all be process towards the end of the production process.

In an example, the Touch Screen may have its capacitive, resistive, piezoelectric or other detection schemes films already placed upon the glass. As well the LCD or OLED or other display screen components may also be already deployed upon the substrate. Protective films may be applied to the front side of the Touch Screen so that it may be handled by automation equipment in the cleanspace fabricator. The various elements and films may limit the temperature, electrical charge, magnetic field environments that the substrate may be subjected to in further processing. Nevertheless, the exemplary touchscreen piece may comprise an acceptable substrate for a cleanspace fabricator.

The touchscreen and display components may have electrical connections that are formed upon the back of the Touchscreen substrate. In some embodiments, layers of flexible connector or flexible substrate materials may be connected and stacked upon the back of the substrate, forming routing lines for signals and power. These processing steps may occur in a cleanspace fabrication environment. Although the sensitivity to particulate components may be less for these applications than for making integrated components, particulate control will nevertheless be necessary as may be achieved in the cleanspace environment.

In an alternative to flexible connector substrates, in other embodiments metallic films may be deposited and imaged to create conductors patterns. Lithography together with etching techniques, such as reactive ion etching or wet chemical etching may be used to etch the metallic insulator layer. By combining the processing of imaged metal layers and dielectric layers with via holes, a multilayer routing scheme may be processed onto the back of the Touchscreen Substrate. These routing lines or conductive traces may interconnect the Touchscreen components to each other or to electrical circuitry. As well, the interconnect traces may connect electrical components to each other regardless of whether for those particular traces, a touch screen component is connected. The substrate can support the interconnection of various components.

Touch Screen Products Fabricated in Cleanspace Fabricators

Figure 7:
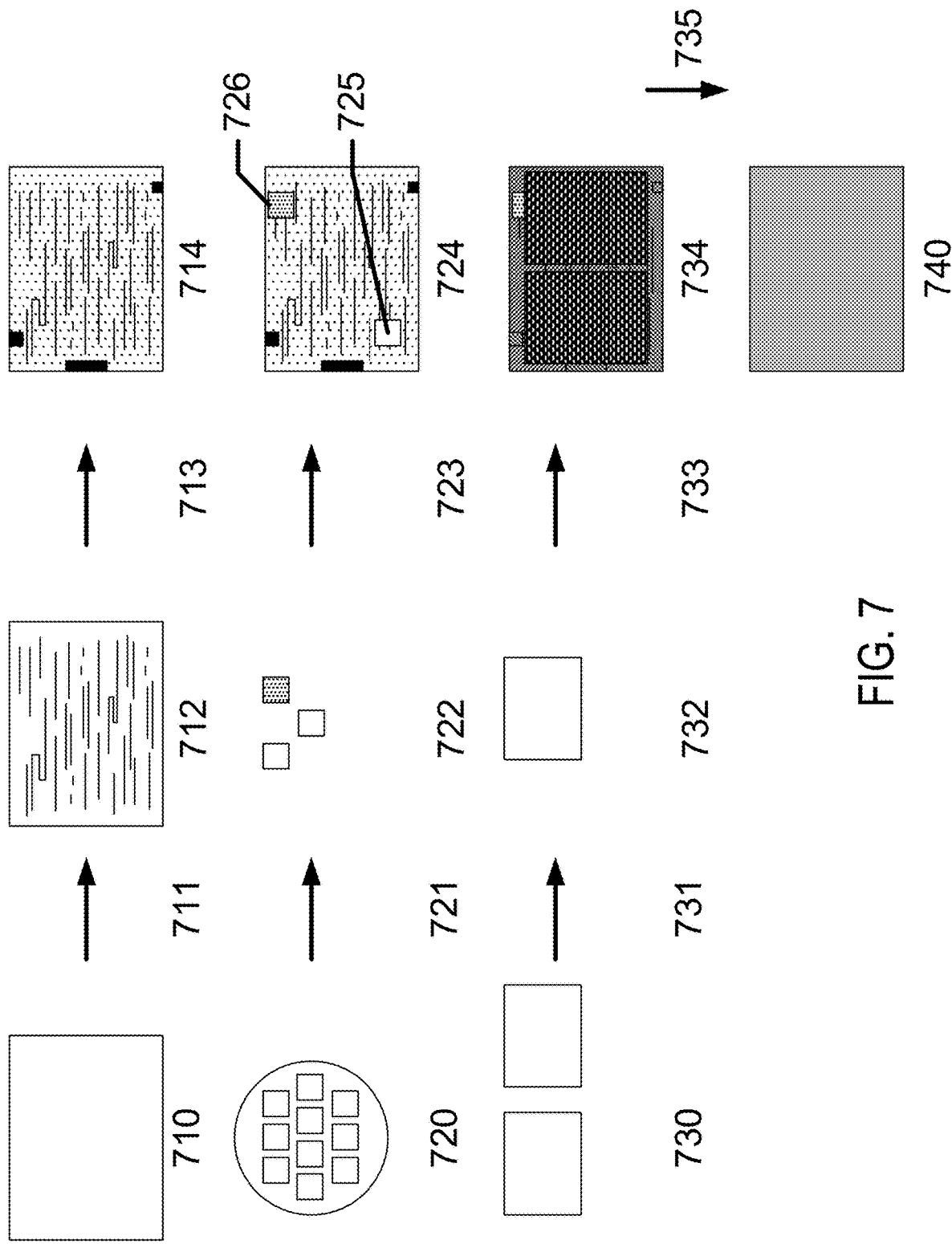
FIG. 7 illustrates processing of different substrate types in cleanspace environments resulting in a product combining devices from the different substrate types.

Proceeding to FIG. 7, the touch screen processing described in the previous section as well as a more general discussion of fabricating touchscreen based products in cleanspace fabricators may be found. At 710, a Touchscreen type substrate is depicted. It may have touchscreen elements, display elements and input/output elements like switches already configured upon it or these may be attached at a later time.

At 711, the processing to make a multilayer routing scheme of imaged metallic traces separated by insulator levels with via interconnects may occur. In some other embodiments, multiple layers of flexible interconnect layers may be adhered and interconnected at 711. The result at 712 may be a Touchscreen substrate that has interconnection traces upon it. The topmost later of interconnects may have terminal via points were additional components may be connected.

Before connecting additional components at 713 a layer of encapsulating material may be applied to the substrate. The encapsulating material may be comprised of various polymeric materials and adhesive materials like epoxies for example that have both insulating properties and chemical encapsulating properties. In some embodiments the materials may be applied by spray processes or rolled applicators or other bulk application processes which may be followed by steps to create via holes in the layer for interconnection of other devices. In other embodiments the materials may be directly printed upon the substrate. With three dimensional printing techniques or more generally with additive manufacturing technologies, the encapsulating layer may be built upon the substrate during step 713 and have missing printed features for vias. In other embodiments both encapsulating features and conductive vias may be added to the layer by additive manufacturing processing. In an example an insulating epoxy and a conductive epoxy may be used to create a layer that has predominantly insulating regions as well as conductive vias. Other additive manufacturing processes may create metallic features at the via locations as for example with a power based laser sintering process.

The conductive films of conductive epoxies or of sintered powder based deposits may comprise Titanium, Gold, Silver, and Copper for example. And the starting material for the powders or within the epoxies may comprise microscopic and nanoscopic powders made from Titanium, Gold, Silver and Copper as examples.

The resulting encapsulated Touchscreen substrate with multilayer interconnect schemes may be found at 714. In some embodiments, external components for external connections and input/output functions may be added to the substrate as shown in exemplary form as the solid black features at 714. These features may represent power interconnections, signal interconnections, switches of various kinds and the like.

Another type of substrate to run in the same cleanspace fabricator or in an attached or associated cleanspace fabricator may be a semiconductor substrate as shown at 720. Through numerous processing steps, integrated circuit components may be manufactured upon the semiconductor substrate in manners related to those discussed in other inventive art associated with cleanspace fabricators. The resulting product wafer at 720 may subsequently be processed at 721 to thin the substrate material and in some embodiments to singulate the integrated circuits creating "Die" or "Dice" as shown at 722. These die may be added to the Touchscreen substrate during the process at 723. The processes at 723 may include flip-chip solder ball related attachment as an example but the general art of connecting integrated circuit die to packaging may be consistent. In the case of the depicting at 724; however, the die may be attached in a non-packaged form directly to the touchscreen substrate as item 725 for example. The die may be tested at various points both before being attached to the Touchscreen substrate and after being attached.

In a subsequent section, three dimensional assembly and three dimensional IC manufacturing techniques will be discussed. The result of these processing steps may likewise be attached at step 724 in the location identified as items 726. In some embodiments, the three dimensional assembly processing may occur stepwise and use the Touchscreen substrate to support the die as they are processed and ultimately attached to the substrate.

At 730, a third type of substrate may be processed through the cleanspace fabricator environments. A critical component in electronic products is the energization elements that power the function of the products. In some embodiments, these elements may be batteries which may typically be rechargeable type batteries. The basic structure of batteries of various types may include a cathode electrode along with a cathode chemical moiety electrically connected to the cathode electrode. The cathode, both electrode and chemistry, may be then contacted to a separator region along with an electrolyte in the separator region. The separator region may allow the electrolyte or ionic portions of the electrolyte to transfer across it. On the other side of the separator region may be the anode region which may comprise both an anode chemical moiety and an electrically connected conductive anode electrode. The construction of structures of this type may be performed in a cleanspace fabrication environment. At 731, the two conductive electrode plates may be processed to form a cathode/separator electrolyte/anode structure. Rechargeable solid state batteries as well as chemical form batteries may be constructed. In some embodiments large plate batteries, sometime of more than two electrode levels may be formed at 732. In other embodiments, that may preferably be constructed in cleanspace environments, the battery plates with 732 may be formed of numerous individual battery regions which form many different battery cells. The techniques and requirements to form such batteries may be favored by the processing environment of a cleanspace fabricator.

There may be numerous reasons to assemble the battery units with multiple cells. The individual cells may be connected in various parallel and serial fashions for different purposes, and they may be attached to integrated circuits which control the use of the individual battery cells. The integrated circuits may control the charging and discharging of the multiple cells as well as sense their functionality for defective and non-functioning cells.

Batteries have significant energy storage capabilities. However, fuel cells offer the potential of multiplying the energy storage capabilities. Fuel cells function by extracting the chemical energy of chemical feedstock. Various chemical species have been used in standard fuel cell technology. Gasses such as hydrogen have been used, but liquids may also be used. Methanol and Ethanol may have the capability ultimately of a ten to twenty fold increase in energy density.

A fuel cell is made of multiple layers that are similar to a battery construction. Conductive anode and cathode contacting layers are used to collect the charge carrying species. However, the chemical feed stock must be able to move from external to the fuel cell to anode layers that also include catalysts for the dissociation of the chemical species. A permeable membrane may separate the anode catalyst from the cathode catalyst layer. A permeable layer to oxygen flow may separate the catalyst from the cathode conductive layer. The above discussions may describe in general terms the types of layers that may be comprised in batteries and fuel cells to illustrate the applicability of the cleanspace fabrication environment to the construction of devices of these types.

In some embodiments batteries may be fabricated, in other embodiments fuel cells may be fabricated. In other embodiments regions of batteries and regions of fuel cells may be fabricated. These elements may be directly fabricated upon each other or at 734 they may be fabricated directly up the assembled devices on the Touch screen substrate. At 733, in embodiments where the fuel cells and/or batteries are made separately from the touchscreen substrate they may be added and connected to the Touch screen substrate. The electrical connection and bonding of the devices again may benefit from a clean environment for defect mitigation. The connected battery and fuel cell components may also be coated and encapsulated by various techniques at 734. A cleanspace fabricator environment may assemble complicated technology processing tools of various kinds in single locations. Particularly when the tools are smaller in size, this may allow for the ability of constructing more complicated battery and fuel cell structures in processes that are similar to that utilized in semiconductor and MEMS processing.

In some embodiments, the described components may define an entire functional touchscreen device such as a mobile phone or a tablet or lap top computer. At step 735 the resulting product may next be encapsulated and finished in various manners to form the device at 740. In some additive manufacturing steps, a plastic body layer may be formed. In other steps a metal case may be formed by additive manufacturing. Alternatively, a fabricated metal cover may be adhesively attached to the touch screen substrate device. By incorporating many components into small devices, the potential exists for the heat created by the components to cause thermal issues. Additive manufacturing may also provide for the ability to embed thermally conductive structures that spread and dissipate thermal load from hot spots through the entire device.

There may be abundant variation in the processing of products like that described at 740. In the exemplary description, the use of direct encapsulation may offer enhanced structural strength and chemical resistance. In addition to higher strength design potential or lower material weight of the structure, these factors may allow for novel embodiments to fill fuel cell power sources and may even include immersion of portions of the device in the chemical feedstock since the encapsulation may protect components from exposure.

A cleanspace fabrication entity that can tie together so many elements of construction of complicated electronic devices may provide numerous and significant advantages for a development process. Many aspects of the design process may flexibly be changed with the cleanspace fabricator based infrastructure, such as improved times and cost factors. In addition, the quality of products will improve with the ability to produce more prototypes in actual forms at lower prototyping costs.

Advantages also exist for manufacturing in such environments. In practice, the cleanspace fabricator environment may be a small tool based environment that occupies the same cleanspace as the other processing types. Alternatively, a large tool semiconductor cleanspace fabricator may be attached to other cleanspace fabricators for the other processing and the assembly processes. Advantages will increase as the complexity of components integrated into products increases.

3DIC Techniques in Cleanspace Fabricators

Figure 8:
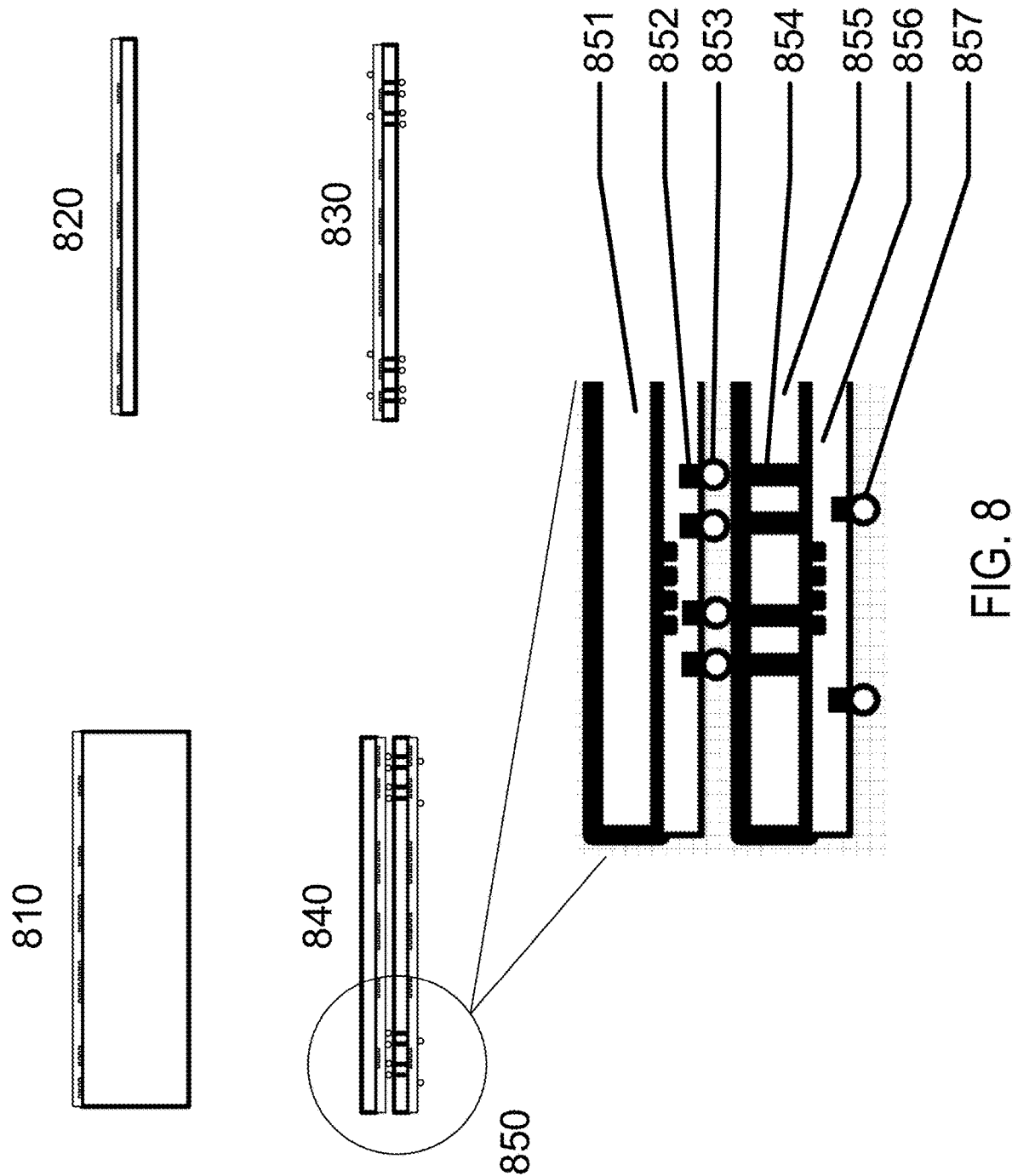
FIG. 8 illustrates examples of processing that occurs in three dimensional Integrated Circuit or three dimensional packaging technology.

Proceeding to FIG. 8, a depiction of an exemplary processing flow for Three Dimensional Integrated Circuits (3DIC) is shown. A related field of Three Dimensional Chip Packaging will be enabled in much the same manner for a cleanspace fabricator environment. At 810, a cross section of a semiconductor wafer for a region of a portion of an integrated circuit is depicted. A thin region on the substrate contains and supports the integrated circuit, while a bulk of the substrate is relatively unrelated to the function of the integrated circuit. A typical process, at 820, may result from thinning the substrate, at least in regions of the wafer. At 830 various features related to 3DIC or 3D packaging may be formed including through silicon vias and solder ball features. The results at 830 in various forms may then be stacked either upon each other or upon packaging structures to exploit three dimensional spaces at 840. In some embodiments, substrates with structures such as through silicon vias may be formed, either with or without associated circuitry.

In the inset of 850, a schematic relationship of the various aspects of 3DIC or 3D packaging may be observed. In the depiction a substrate, 855 with circuitry upon it at 856 may have through silicon vias processing at 854. The vias may make an electrical connection from the front of the substrate where the circuitry is to the back of the substrate. At the back of the substrate interconnection features such as the solder balls depicted at 853 may connect a next circuit on a substrate at 851 through the metal layers of the circuit at 852.

The various processing steps, related to 3DIC and 3D packaging, are easily incorporated into cleanspace fabricator type structures. Substrate or Silicon reactive ion etching to create through silicon vias as well as the thinning operations on substrates, the processing to create interconnection elements such as solder balls and the like are consistent with a cleanspace environment where a cleanliness level of the environment is positive to the quality of the result.

The cleanspace environment based fabricators may create a new infrastructure that enables cost effective operation at small substrate size. The use of small substrates for the IC processing also creates additional advantages for the 3DIC and 3D Packaging processes. A small substrate may be made much thinner in its initial form; for example a two inch substrate may start at 280 microns of thickness while an eighteen inch substrate may start at 925 microns of thickness. In some 3DIC and 3D Packaging processes portions of a wafer will be thinned leaving edge rings or internal ridges to support the wafer while being processed for the 3D related needs. A smaller substrate may start out thin enough, or be fully thinned across its body, or have a much thinner portion of the substrate after a thinning process. In addition, angular errors in the alignment of the front of substrates to the back of substrates result in far smaller errors in distance terms the smaller the radius of processing is from the center of the wafer. All of these aspects may improve processing costs, times and quality as well as enabling more processing flexibility for novel processing.

Additive Manufacturing in Cleanspace Fabricators

Additive Manufacturing may represent a class of fabrication techniques that place material into or upon manufactured items to realize three dimensional forms that are represented in a digital format. An example of such a technique may be three dimensional printing where droplets of material are placed upon a substrate in a similar fashion that ink is placed upon a paper as either the paper passes under a printing component or the printing component moves above the paper. Another additive technique may be stereolithography, where a substrate is immersed in a liquid of reactive material and lowered layer by layer as a laser pattern writing source hardens reactive mixture in select regions of each layer. There are similar powder based additive manufacturing formats as well just to name some examples. Various materials may be shaped in these manners including metals, insulators, gels and the like. Composite materials may also be formed that may mix these materials or incorporate other materials in a matrix that is grown—such as the forming of three dimensional lattices of cellular material.

Additive Manufacturing techniques are well fitted in a cleanspace fabrication environment. The ability to prototype shapes based upon digital models allows for complex products that include semiconductor components to be rapidly formed. In the previous example of Touch screen based processing for example encapsulating material may be processed by additive manufacturing techniques. In some of the examples metal features may be formed within the manufactured form for various reasons. The ability to process substrates in a cleanspace environment may allow for chips to be incorporated into product forms where the chip is never discretely packaged, an entire layer of the product may be encapsulated at a time. This may allow for smaller form factors with lower cost or improved technical aspects like strength and thermal dissipative aspects.

The use of raw die attached directly to a substrate formed upon an active Touch screen display substrate may allow for the integrated circuits to be tested as the assembly processing occurs. Since the testing may occur before any encapsulation of the semiconductor dice occurs and before the multilayer distribution levels are encapsulated, defective conditions found during the test may be remedied with various kinds of rework or use of redundant die attachment strategies.

As mentioned, manufacturing may be effectively carried out in the cleanspace environments. However, prototyping may be particularly effective in a fabricator environment with multiple types of fabrication as discussed. Changes to die design, changes to multilayer routing schemes, addition or removal of components or interface elements like switches or connectors can all be flexibly adopted into the digital models for the encapsulating and packaging/case designs for the finished products that can be manufactured using the additive design capabilities. The small tool cleanspace fabricator designs may have additional advantages since specialized processing tools or processing tools with engineering changes to support a prototype need are effectively supported in the environment of small reversibly replaceable tools that interface with tool chassis formats.

Figure 9:
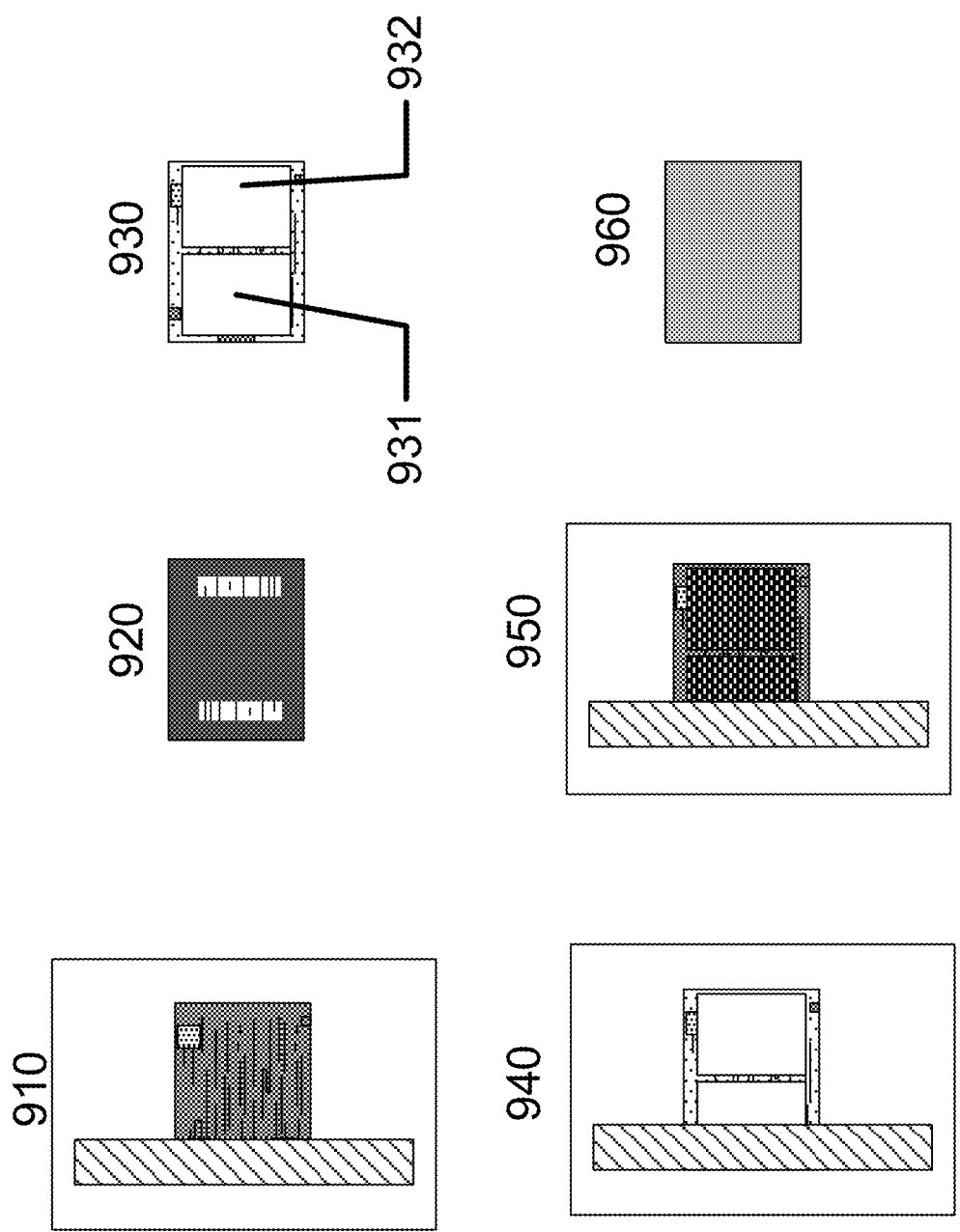
FIG. 9 illustrates examples of additive processing techniques that may be carried out in cleanspace fabrication environments.

Proceeding to FIG. 9, some aspects of additive design that may be carried out in the cleanspace fabricator designs may be found. Utilizing the exemplary Touchscreen type substrate as a base for examples, at 910 an additive manufacturing processing tool which may be located within multi-level cleanspace fabricator which has automation capable of handling the Touchscreen substrate may be depicted. The Touchscreen substrate may have been moved from one processing tool to this additive manufacturing tool by the automation tooling in FIG. 5 at 530 for example. In the example, the touch screen substrate may have had its final layer of metal interconnections deposited and then integrated circuits bonded in the prior operations. In the additive manufacturing tool an encapsulating and sealing layer may be printed upon the substrate in select areas that have been digitally modeled to be appropriate for the substrate design and the needs to add components to it at subsequent steps. The result of the processing may be seen in the example of item 920 where a planarized film layer indicated in the solid black pattern with interruptions at bonding locations may be formed.

Continuing the example at 930 a set of energization elements may be added to the substrate. Item 931 may represent a battery component while item 932 may represent a fuel cell component being attached to the touch screen substrate. The substrate with attached energization elements may be moved by automation into an additive manufacturing tool at 940 where an encapsulation layer may be deposited across the entire device resulting in the coated piece shown within the additive manufacturing tool at 950. At 950, another additive manufacturing step may be performed to build the structural case around the encapsulated components. In some embodiments, metal casing may be formed by the additive manufacturing processes. In other embodiments, the additive manufacturing process may add plastic or polymeric materials to define the casing of the device. In still further embodiments, the additive manufacturing tool may add adhesives to the substrate in digitally modeled locations and a case plate may subsequently be placed upon the substrate. At 960 an exemplary finished piece may be found.

Fuel Cells in Cleanspace Fabricators

There may be numerous types of substrates and devices consistent with production in a cleanspace fabricator environment including micro scale machines, biological or standard fluidic processing cells and the like. An application of note related to the examples demonstrated herein may related to the design, development, prototyping and manufacturing of fuel cell components. There are designs of Fuel cell technology that have been around for decades; however the construction of small fuel cell technology has many novel aspects to it and micro-scale elements may have particular sensitivity to particulate and other types of contamination. Construction of prototype fuel cells and production of novel small fuel cell designs fit well within the scope of manufacturing activities that benefit from the novel cleanspace fabricating environment.

The control and miniaturization ability of semiconductor processing tooling may offer advanced processing capabilities that may allow for more intricate and smaller scale features to be formed into fuel cell designs. In addition, as mentioned in prior sections, the flexibility of the cleanspace fabricator environment may allow for the fuel cell designs to be constructed upon device substrates of various types allowing for novel design aspects.

In addition the structures that may contain the fuel for small fuel cells may also be designed, prototyped and manufactured in cleanspace fabricator environments. There may be novel methods of defining pores and membranes into the structure built upon the touch screen substrate. These structures may allow for the filling of chemical into a storage region of the fuel cell. The membrane structures may either allow ethanol and water to pass through, or be stored while filtering out or not absorbing other chemicals for example. There may be numerous means to fill a reservoir for a fuel cell. The encapsulating aspects of the additive processing on substrates processed in clean space environments may allow for novel structures to be formed which nonetheless are isolated from electronic components in the rest of the device.

Product Advantages of Cleanspace Fabrication for Prototyping and Manufacturing

To summarize, the cleanspace fabricator environment along with reversibly removable tools, particularly when the substrates to be processed are small creates a prototyping environment with high speed prototyping capabilities. This is with respect to the processing of substrates in the environment, but also relates to the creation of specialized tools or engineering changes to existing tool designs to support new processes, new materials or other novel requirements to make new types or designs of products.

The flexibility advantages may also relate to manufacturing of products. In some embodiments, tailored products or products with user selectable aspects may be manufactured with ease in cleanspace manufacturing environments with large numbers of processing tools based on the processing of smaller substrates. Customized product definitions may allow for customized security aspects as well for example. The environment may also result in lower part costs due to the lowered requirements on support personnel and the higher numbers of processing tools that may be required when smaller substrates are processed, which may result from economies of scale based on higher numbers of tools as well as advantages that standardization of parts in the small tool chassis models may afford. The fabrication of numerous types of products in the environment may be enabled. As demonstrated for example, Touch screen type products may in some embodiments be produced in large scale where the same environment is used to make the integrated circuits, the interconnection schemes, the touch-screen components, and the energization elements that comprise electronic devices with touch screens.

GLOSSARY OF SELECTED TERMS

Air receiving wall: a boundary wall of a cleanspace that receives air flow from the cleanspace.

Air source wall: a boundary wall of a cleanspace that is a source of clean airflow into the cleanspace.

Annular: The space defined by the bounding of an area between two closed shapes one of which is internal to the other.

Automation: The techniques and equipment used to achieve automatic operation, control or transportation.

Ballroom: A large open cleanroom space devoid in large part of support beams and walls wherein tools, equipment, operators and production materials reside.

Batches: A collection of multiple substrates to be handled or processed together as an entity Boundaries: A border or limit between two distinct spaces—in most cases herein as between two regions with different air particulate cleanliness levels.

Circular: A shape that is or nearly approximates a circle.

Clean: A state of being free from dirt, stain, or impurities—in most cases herein referring to the state of low airborne levels of particulate matter and gaseous forms of contamination.

Cleanspace: A volume of air, separated by boundaries from ambient air spaces, that is clean.

Cleanspace Fabricator: A fabricator where the processing of substrates occurs in a cleanspace that is not a typical cleanroom, in many cases because there is not a floor and ceiling within the primary cleanspace immediately above and below each tool body's level; before a next tool body level is reached either directly above or below the first tool body.

Cleanspace, Primary: A cleanspace whose function, perhaps among other functions, is the transport of jobs between tools.

Cleanspace, Secondary: A cleanspace in which jobs are not transported but which exists for other functions, for example as where tool bodies may be located.

Cleanroom: A cleanspace where the boundaries are formed into the typical aspects of a room, with walls, a ceiling and a floor.

Cleanroom Fabricator: A fabricator where the primary movement of substrates from tool to tool occurs in a cleanroom environment; typically having the characteristics of a single level, where the majority of the tools are not located on the periphery.

Core: A segmented region of a standard cleanroom that is maintained at a different clean level. A typical use of a core is for locating the processing tools.

Dicing: A process of cutting out segments of a substrate into smaller discrete entities sometimes called chips, dice or die.

Ducting: Enclosed passages or channels for conveying a substance, especially a liquid or gas—typically herein for the conveyance of air.

Envelope: An enclosing structure typically forming an outer boundary of a cleanspace.

Fab (or fabricator): An entity made up of tools, facilities and a cleanspace that is used to process substrates.

Fabricator Cleanspace: The portion of a cleanspace fabricator where the primary movement of substrates from tool to tool occurs; which is a primary cleanspace environment that is not a cleanroom environment; typically having the characteristics of multiple levels, where the majority of the tools are located on the periphery. When there are multiple Fabricator Cleanspaces within a single location they may be separated spatially and/or have different characteristics of the primary cleanspace such as a different ambient particle level for example.

Fit up: The process of installing into a new clean room the processing tools and automation it is designed to contain.

Flange: A protruding rim, edge, rib, or collar, used to strengthen an object, hold it in place, or attach it to another object. Typically herein, also to seal the region around the attachment.

Folding: A process of adding or changing curvature.

HEPA: An acronym standing for high-efficiency particulate air. Used to define the type of filtration systems used to clean air.

Horizontal: A direction that is, or is close to being, perpendicular to the direction of gravitational force.

Job: A collection of substrates or a single substrate that is identified as a processing unit in a fab. This unit being relevant to transportation from one processing tool to another.

Laminar Flow: When a fluid flows in parallel layers as can be the case in an ideal flow of cleanroom or cleanspace air. If a significant portion of the volume has such a characteristic, even though some portions may be turbulent due to physical obstructions or other reasons, then the flow can be characterized as in a laminar flow regime or as laminar.

Logistics: A name for the general steps involved in transporting a job from one processing step to the next. Logistics can also encompass defining the correct tooling to perform a processing step and the scheduling of a processing step.

Matrix: An essentially planar orientation, in some cases for example of tool bodies, where elements are located at discrete intervals along two orthogonal axes directions.

Multifaced: A shape having multiple faces or edges.

Nonsegmented Space: A space enclosed within a continuous external boundary, where any point on the external boundary can be connected by a straight line to any other point on the external boundary and such connecting line would not need to cross the external boundary defining the space.

Perforated: Having holes or penetrations through a surface region. Herein, said penetrations allowing air to flow through the surface.

Peripheral: Of, or relating to, a periphery.

Periphery: With respect to a cleanspace, refers to a location that is on or near a boundary wall of such cleanspace. A tool located at the periphery of a primary cleanspace can have its body at any one of the following three positions relative to a boundary wall of the primary cleanspace: (i) all of the body can be located on the side of the boundary wall that is outside the primary cleanspace, (ii) the tool body can intersect the boundary wall or (iii) all of the tool body can be located on the side of the boundary wall that is inside the primary cleanspace. For all three of these positions, the tool's port is inside the primary cleanspace. For positions (i) or (iii), the tool body is adjacent to, or near, the boundary wall, with nearness being a term relative to the overall dimensions of the primary cleanspace.

Planar: Having a shape approximating the characteristics of a plane.

Plane: A surface containing all the straight lines that connect any two points on it.

Polygonal: Having the shape of a closed figure bounded by three or more line segments Process: A series of operations performed in the making or treatment of a product—herein primarily on the performing of said operations on substrates.

Robot: A machine or device, that operates automatically or by remote control, whose function is typically to perform the operations that move a job between tools, or that handle substrates within a tool.

Round: Any closed shape of continuous curvature.

Substrates: A body or base layer, forming a product, that supports itself and the result of processes performed on it.

Tool: A manufacturing entity designed to perform a processing step or multiple different processing steps. A tool can have the capability of interfacing with automation for handling jobs of substrates. A tool can also have single or multiple integrated chambers or processing regions. A tool can interface to facilities support as necessary and can incorporate the necessary systems for controlling its processes.

Tool Body: That portion of a tool other than the portion forming its port.

Tool Port: That portion of a tool forming a point of exit or entry for jobs to be processed by the tool. Thus the port provides an interface to any job-handling automation of the tool.

Tubular: Having a shape that can be described as any closed figure projected along its perpendicular and hollowed out to some extent.

Unidirectional: Describing a flow which has a tendency to proceed generally along a particular direction albeit not exclusively in a straight path. In clean airflow, the unidirectional characteristic is important to ensuring particulate matter is moved out of the cleanspace.

Unobstructed removability: refers to geometric properties, of fabs constructed in accordance with the present invention, that provide for a relatively unobstructed path by which a tool can be removed or installed.

Utilities: A broad term covering the entities created or used to support fabrication environments or their tooling, but not the processing tooling or processing space itself. This includes electricity, gasses, airflows, chemicals (and other bulk materials) and environmental controls (e.g., temperature).

Vertical: A direction that is, or is close to being, parallel to the direction of gravitational force.

While the invention has been described in conjunction with specific embodiments, it is evident that many alternatives, modifications and variations will be apparent to those skilled in the art in light of the foregoing description. Accordingly, this description is intended to embrace all such alternatives, modifications and variations as fall within its spirit and scope.

What is claimed is:

1. A method of producing customized touch screen type products comprising:
   receiving a customized product definition comprising selections by a user of user selectable aspects, wherein the custom user selections create processing flows for a tailored touch screen type product;
   introducing a metallic case into a cleanspace fabricator, wherein:
   the cleanspace fabricator comprises a first matrix comprising at least two discrete processing tools, each discrete processing tool comprising a tool body and a tool port, the at least two discrete processing tools oriented one on top of the other along a vertical, wherein said at least two discrete processing tools are partially located in a first fabricator cleanspace comprising a first boundary and a second boundary and each of the at least two discrete processing tools is capable of independent operation and removable in a discrete fashion relative to other discrete processing tools;
   introducing a glass substrate into the cleanspace fabricator, wherein the glass substrate design is consistent with the custom user selections;
   attaching the glass substrate to the metallic case, wherein the metallic case design is consistent with the custom user selections;
   adding an unpackaged and diced integrated circuit chips upon a layer supported upon the glass substrate, wherein the integrated circuit layer design is consistent with the custom user selections;
   adding an energization element upon a layer supported upon the glass substrate; and
   adding an encapsulating layer upon the integrated circuits and the energization element upon the full glass substrate, wherein an additive manufacturing step is used to pattern the encapsulating layer.

2. The method of producing products of claim 1 additionally comprising:
   forming a touchscreen device within the cleanspace fabricator from processing of a semiconductor substrate and the glass substrate, wherein the touchscreen device has customized security aspects.

3. The method of producing products of claim 1 additionally comprising:
   introducing electronic switches and electronic interconnects into the cleanspace fabricator.

4. The method of producing products of claim 1 wherein the energization element comprises one or more of battery components or fuel cell components.

5. The method of producing products of claim 1 wherein the cleanspace fabricator operates without humans occupying any portion of the cleanspace.

6. The method of producing products of claim 1 additionally comprising:
   removing a first discrete processing tool through a wall on the periphery of the cleanspace; and removing a second discrete processing tool through a wall on the periphery of the cleanspace, wherein the second discrete processing tool is oriented on top of the first discrete processing tool other along a vertical.

7. The method of producing products of claim 1 additionally comprising drilling a 3DIC via in a substrate within the same cleanspace that is used to form the energization element.

8. The method of producing products of claim 1 additionally comprising forming a conductive epoxy into a conductive interconnect within the same cleanspace that is used to form the energization element.

9. The method of producing products of claim 1 additionally comprising:
   handing an integrated circuit to a tool port of a first discrete processing tool with a first type of automation equipment sized to handle an integrated circuit; and receiving the glass substrate comprising the integrated circuit out of the tool port of the first discrete processing tool with a second type of automation equipment sized to handle the glass substrate.

10. The method of producing products of claim 1 additionally comprising: processing laser sintering, depositing metal interconnects, forming solder interconnects, and forming a battery anode with discrete tools interfacing with the same cleanspace.

11. A method of producing customized touch screen type products comprising:
    utilizing a single cleanspace fabricator to perform processing, wherein:
    the cleanspace fabricator comprises a first matrix comprising at least two discrete processing tools, each discrete processing tool comprising a tool body and a tool port, the at least two discrete processing tools oriented one on top of the other along a vertical, wherein said at least two discrete processing tools are partially located in a first fabricator cleanspace comprising a first boundary and a second boundary and each of the at least two discrete processing tools is capable of independent operation and removable in a discrete fashion relative to other discrete processing tools;
    receiving a customized product definition comprising selections by a user of user selectable aspects, wherein the custom user selections create processing flows for a tailored touch screen type product;
    introducing a glass substrate into the cleanspace fabricator, wherein the glass substrate design is consistent with the custom user selections;
    attaching the glass substrate to a metallic case, wherein the metallic case design is consistent with the custom user selections;

adding an integrated circuit upon a layer supported upon the glass substrate, wherein the metallic case design is consistent with the custom user selections;
adding an energization element upon a layer supported upon the glass substrate;
forming a customized touchscreen device within the cleanspace fabricator from processing of the semiconductor substrate and the glass substrate;
introducing electronic switches and electronic interconnects into the cleanspace fabricator; and wherein the cleanspace fabricator operates without humans occupying any portion of the cleanspace.

\* \* \* \* \*